United States Patent
Lei et al.

(10) Patent No.: US 6,866,746 B2
(45) Date of Patent: Mar. 15, 2005

(54) CLAMSHELL AND SMALL VOLUME CHAMBER WITH FIXED SUBSTRATE SUPPORT

(75) Inventors: Lawrence C. Lei, Milpitas, CA (US); Alfred W. Mak, Union City, CA (US); Gwo-Chuan Tzu, Sunnyvale, CA (US); Avi Tepman, Cupertino, CA (US); Ming Xi, Sunnyvale, CA (US); Walter Benjamin Glenn, Pacifica, CA (US)

(73) Assignee: Applied Materials, Inc., Santa Clara, CA (US)

( * ) Notice: Subject to any disclaimer, the term of this patent is extended or adjusted under 35 U.S.C. 154(b) by 107 days.

(21) Appl. No.: 10/302,774

(22) Filed: Nov. 21, 2002

(65) Prior Publication Data

US 2003/0221780 A1 Dec. 4, 2003

Related U.S. Application Data

(60) Provisional application No. 60/352,190, filed on Jan. 26, 2002.

(51) Int. Cl.[7] .......................... C23C 16/00; C23F 1/00; H01L 21/306
(52) U.S. Cl. .................. 156/345.29; 118/715; 118/733
(58) Field of Search ................................ 118/715, 733; 156/345.29

(56) References Cited

U.S. PATENT DOCUMENTS

| | | | | |
|---|---|---|---|---|
| 3,649,339 A | * | 3/1972 | Smith ......................... | 417/152 |
| 3,973,665 A | * | 8/1976 | Giammanco ................ | 198/775 |
| 4,058,430 A | | 11/1977 | Suntola et al. .............. | 156/611 |
| 4,389,973 A | | 6/1983 | Suntola et al. .............. | 118/725 |
| 4,413,022 A | | 11/1983 | Suntola et al. ........... | 427/255.2 |
| 4,729,306 A | * | 3/1988 | Bubley ....................... | 101/114 |
| 4,834,831 A | | 5/1989 | Nishizawa et al. ......... | 156/611 |
| 4,993,357 A | | 2/1991 | Scholz ....................... | 118/715 |
| 5,225,366 A | | 7/1993 | Yoder ......................... | 437/108 |
| 5,281,274 A | | 1/1994 | Yoder ......................... | 118/697 |
| 5,294,286 A | | 3/1994 | Nishizawa et al. ......... | 156/610 |
| 5,374,570 A | | 12/1994 | Nasu et al. .................. | 437/40 |
| 5,383,971 A | * | 1/1995 | Selbrede ..................... | 118/728 |
| 5,441,703 A | | 8/1995 | Jurgensen ................... | 422/129 |
| 5,443,647 A | | 8/1995 | Aucoin et al. ........ | 118/723 ME |
| 5,480,818 A | | 1/1996 | Matsumoto et al. ......... | 437/40 |

(List continued on next page.)

FOREIGN PATENT DOCUMENTS

| | | | |
|---|---|---|---|
| EP | 1167569 | 1/2002 | ......... C23C/16/455 |
| JP | 58-098917 | 6/1983 | ......... H01L/21/205 |
| JP | 05-047666 | 2/1993 | ......... H01L/21/205 |

(List continued on next page.)

Primary Examiner—Jeffrie R. Lund
(74) Attorney, Agent, or Firm—Moser Patterson & Sheridan

(57) ABSTRACT

Embodiments of the present invention generally relate to a clamshell and small volume chamber with a fixed substrate support. One embodiment of a processing chamber includes a fixed substrate support having a substrate receiving surface, a pumping ring disposed around a perimeter of the substrate receiving surface, and a gas distribution assembly disposed over the fixed substrate support. The pumping ring forms at least a portion of a pumping channel and has one or more apertures formed therethrough. The chamber may further include a gas-flow diffuser disposed radially inward of the apertures of the pumping ring. Another embodiment of a processing chamber includes a first assembly comprising a fixed substrate support and a second assembly comprising a gas distribution assembly. The first assembly includes a first assembly body that is shaped and sized so that at least a portion of the first assembly body is below the substrate receiving surface of the substrate support. A hinge assembly couples the first assembly and the second assembly. The first assembly and the second assembly can be selectively positioned between an open position and a closed position.

27 Claims, 10 Drawing Sheets

U.S. PATENT DOCUMENTS

| | | | |
|---|---|---|---|
| 5,483,919 A | | 1/1996 | Yokoyama et al. ............ 117/89 |
| 5,503,875 A | | 4/1996 | Imai et al. ................ 427/255.3 |
| 5,582,866 A | * 12/1996 | | White ..................... 427/248.1 |
| 5,611,865 A | * 3/1997 | | White et al. ................. 118/725 |
| 5,674,786 A | | 10/1997 | Turner et al. ................ 437/225 |
| 5,711,811 A | | 1/1998 | Suntola et al. .............. 118/711 |
| 5,796,116 A | | 8/1998 | Nakata et al. ................. 257/66 |
| 5,807,792 A | | 9/1998 | Ilg et al. ...................... 438/758 |
| 5,835,677 A | | 11/1998 | Li et al. ..................... 392/401 |
| 5,855,680 A | | 1/1999 | Soininen et al. ............. 118/719 |
| 5,879,459 A | | 3/1999 | Gadgil et al. ............... 118/715 |
| 5,916,365 A | | 6/1999 | Sherman ...................... 117/92 |
| 6,015,590 A | | 1/2000 | Suntola et al. .......... 427/255.23 |
| 6,042,652 A | | 3/2000 | Hyun et al. .................. 118/719 |
| 6,085,690 A | * 7/2000 | | Mizuno .................. 118/723 E |
| 6,095,083 A | * 8/2000 | | Rice et al. ................. 118/723 I |
| 6,139,700 A | | 10/2000 | Kang et al. ............ 204/192.17 |
| 6,174,377 B1 | | 1/2001 | Doering et al. ............. 118/729 |
| 6,183,563 B1 | | 2/2001 | Choi et al. ................... 118/715 |
| 6,200,893 B1 | | 3/2001 | Sneh .......................... 438/685 |
| 6,231,672 B1 | | 5/2001 | Choi et al. ................... 118/715 |
| 6,270,572 B1 | | 8/2001 | Kim et al. ..................... 117/93 |
| 6,305,314 B1 | | 10/2001 | Sneh et al. ............. 118/723 R |
| 6,306,216 B1 | | 10/2001 | Kim et al. ................... 118/725 |
| 6,447,607 B2 | | 9/2002 | Soininen et al. ............. 117/200 |
| 6,478,872 B1 | | 11/2002 | Chae et al. .................... 117/88 |
| 6,481,945 B1 | | 11/2002 | Hasper et al. ............... 414/217 |
| 6,511,539 B1 | | 1/2003 | Raaijmakers ................ 117/102 |
| 6,551,406 B2 | | 4/2003 | Kilpi .......................... 118/728 |
| 2001/0000866 A1 | | 5/2001 | Sneh et al. ............. 118/723 IR |
| 2001/0009140 A1 | | 7/2001 | Bondestam et al. ........ 118/725 |
| 2001/0011526 A1 | | 8/2001 | Doering et al. ............. 118/729 |
| 2001/0013312 A1 | | 8/2001 | Soininen et al. .............. 117/86 |
| 2001/0014371 A1 | | 8/2001 | Kilpi ..................... 427/255.28 |
| 2001/0042523 A1 | | 11/2001 | Kesala ........................ 122/6.6 |
| 2001/0042799 A1 | | 11/2001 | Kim et al. ................... 239/553 |
| 2001/0054377 A1 | | 12/2001 | Lindfors et al. ............ 117/104 |
| 2002/0000196 A1 | | 1/2002 | Park ........................... 118/715 |
| 2002/0007790 A1 | | 1/2002 | Park ........................... 118/715 |
| 2002/0041931 A1 | | 4/2002 | Suntola et al. ......... 427/255.28 |
| 2002/0052097 A1 | | 5/2002 | Park ........................... 438/507 |
| 2002/0086106 A1 | | 7/2002 | Park et al. ................ 427/248.1 |
| 2002/0092471 A1 | | 7/2002 | Kang et al. .................. 118/715 |
| 2002/0094689 A1 | | 7/2002 | Park ........................... 438/694 |
| 2002/0108570 A1 | | 8/2002 | Lindfors ..................... 118/715 |
| 2002/0134307 A1 | | 9/2002 | Choi ........................... 118/715 |
| 2003/0004723 A1 | | 1/2003 | Chihara ....................... 704/260 |
| 2003/0010451 A1 | * 1/2003 | | Tzu et al. ................ 156/345.33 |
| 2003/0075273 A1 | | 4/2003 | Kilpela et al. .......... 156/345.33 |
| 2003/0075925 A1 | | 4/2003 | Lindfors et al. ............. 285/367 |
| 2003/0116087 A1 | * 6/2003 | | Nguyen et al. ............. 118/715 |
| 2003/0132319 A1 | * 7/2003 | | Hytros et al. ................ 239/548 |
| 2003/0172872 A1 | * 9/2003 | | Thakur et al. ............... 118/715 |
| 2003/0221780 A1 | * 12/2003 | | Lei et al. ................ 156/345.29 |
| 2004/0173162 A1 | * 9/2004 | | Rosenstein et al. ......... 118/733 |

FOREIGN PATENT DOCUMENTS

| | | | | |
|---|---|---|---|---|
| JP | 05-206036 | 8/1993 | ......... | H01L/21/205 |
| JP | 05-234899 | 9/1993 | ......... | H01L/21/205 |
| JP | 04-291916 | 10/1993 | | |
| JP | 05-270997 | 10/1993 | ........... | C30B/29/68 |
| JP | 06-224138 | 8/1994 | ......... | H01L/21/205 |
| JP | 2000-319772 | 11/2000 | ........... | C23C/14/24 |
| JP | 2001-020075 | 1/2001 | ........... | C23C/16/44 |
| WO | 96/17107 | 6/1996 | ........... | C23C/16/44 |
| WO | 99/01595 | 1/1999 | ........... | C30B/25/14 |
| WO | 99/65064 | 12/1999 | ........... | H01L/21/00 |
| WO | 00/54320 | 9/2000 | ........... | H01L/21/44 |
| WO | 00/79576 | 12/2000 | ......... | H01L/21/205 |
| WO | 01/17692 | 3/2001 | ........... | B05C/11/00 |
| WO | 02/08488 | 1/2002 | ........... | C23C/16/44 |

* cited by examiner

US 6,866,746 B2

CLAMSHELL AND SMALL VOLUME CHAMBER WITH FIXED SUBSTRATE SUPPORT

CROSS-REFERENCE TO RELATED APPLICATIONS

This application claims benefit of U.S. Provisional Patent Application Ser. No. 60/352,190, filed Jan. 26, 2002, which is herein incorporated by reference.

BACKGROUND OF THE INVENTION

1. Field of the Invention

Embodiments of the present invention generally relate to a clamshell and small volume chamber with a fixed substrate support.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts, and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1. Therefore, there is a great amount of ongoing effort being directed at the formation of substantially void-free and seam-free sub-micron features having high aspect ratios.

FIG. 1 is a schematic cross-sectional view of a prior art processing chamber 100 defining a processing region 150. An opening 112 in the chamber 100 provides access for a robot (not shown) to deliver and retrieve substrates 122 from the chamber 100. A substrate support 124 supports the substrate 122 on a substrate receiving surface 126 in the chamber 100. The substrate support 124 is mounted to a lift motor 130 to raise and lower the substrate support 124. In one aspect, the lift motor 130 lowers the substrate support 124 to a substrate transferring position in which the substrate receiving surface 126 is below the opening 112 so that substrates 122 may be transferred to or from the substrate support 124. In another aspect, the lift motor 130 raises the substrate support 124 to a deposition position in which the substrate 122 is in close proximity to a showerhead 140. The showerhead 140 has a central gas inlet 144 for the injection of gases and has a plurality of holes 142 to accommodate the flow of gases therethrough to the substrate 122 disposed on the substrate support 124.

One problem with the use of chamber 100 is aligning the substrate support 124 within the chamber 100. The substrate support 124 may require removal so that the area under the substrate support 124 can be cleaned during routine maintenance. Reinstallation of the substrate support 124 requires aligning the substrate support 124 within the chamber 100. Misalignment of the substrate support 124 may cause non-uniformity of processes performed in the chamber.

Thus, there is a need for an improved processing chamber useful for deposition processes such as atomic layer deposition and cyclical layer deposition.

SUMMARY OF THE INVENTION

Embodiments of the present invention generally relate to a clamshell and small volume chamber with a fixed substrate support. One embodiment of a processing chamber includes a fixed substrate support having a substrate receiving surface, a pumping ring disposed around a perimeter of the substrate receiving surface, and a gas distribution assembly disposed over the fixed substrate support. The pumping ring forms at least a portion of a pumping channel and has one or more apertures formed therethrough. The chamber may further include a gas-flow diffuser disposed radially inward of the apertures of the pumping ring.

Another embodiment of a processing chamber includes a first assembly comprising a fixed substrate support and a second assembly comprising a gas distribution assembly. The first assembly includes a first assembly body that is shaped and sized so that at least a portion of the first assembly body is below the substrate receiving surface of the substrate support. A hinge assembly couples the first assembly and the second assembly. The first assembly and the second assembly can be selectively positioned between an open position and a closed position.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
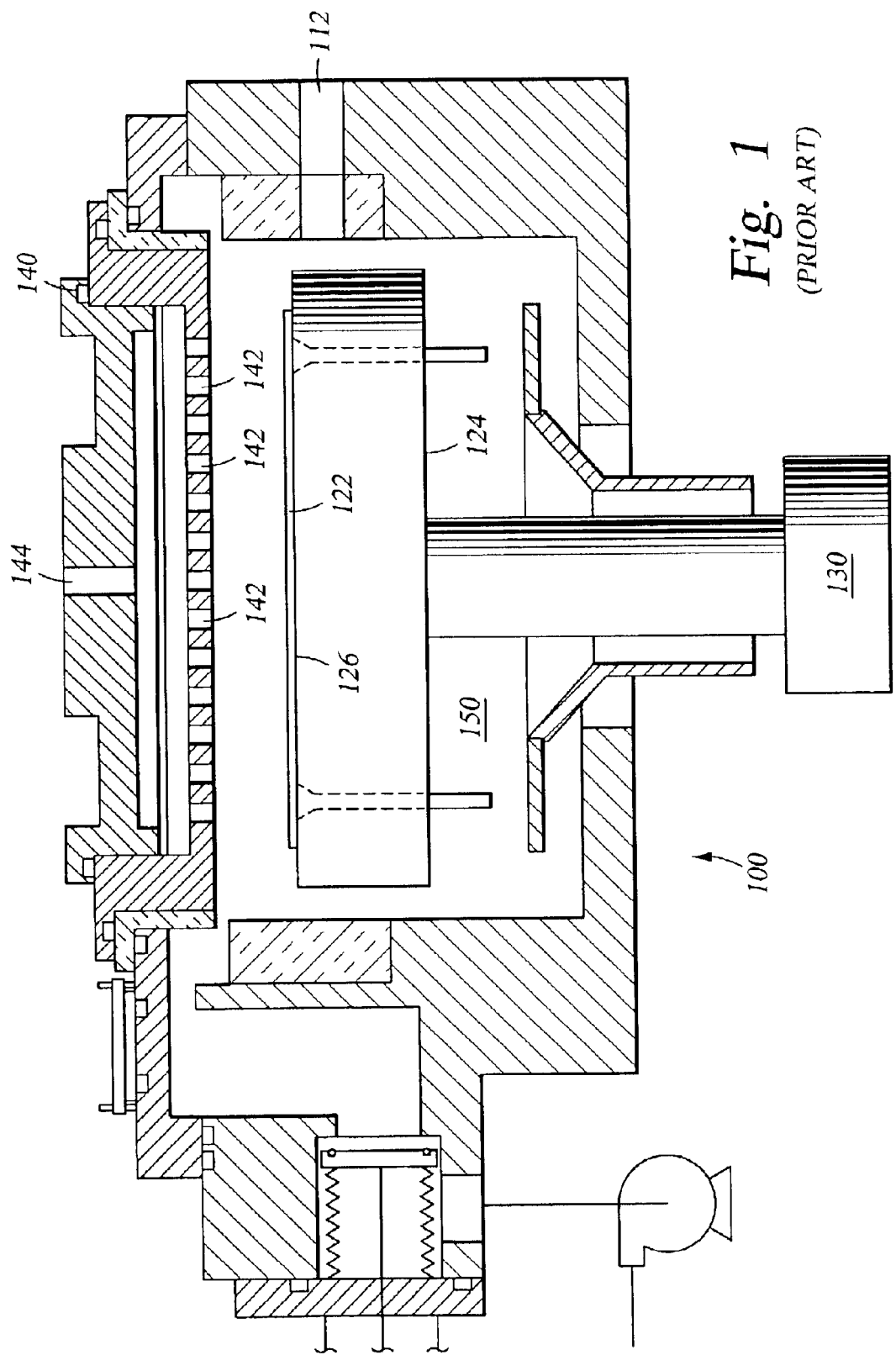
FIG. 1 is a schematic cross-sectional view of a prior art processing chamber.
Figure 2:
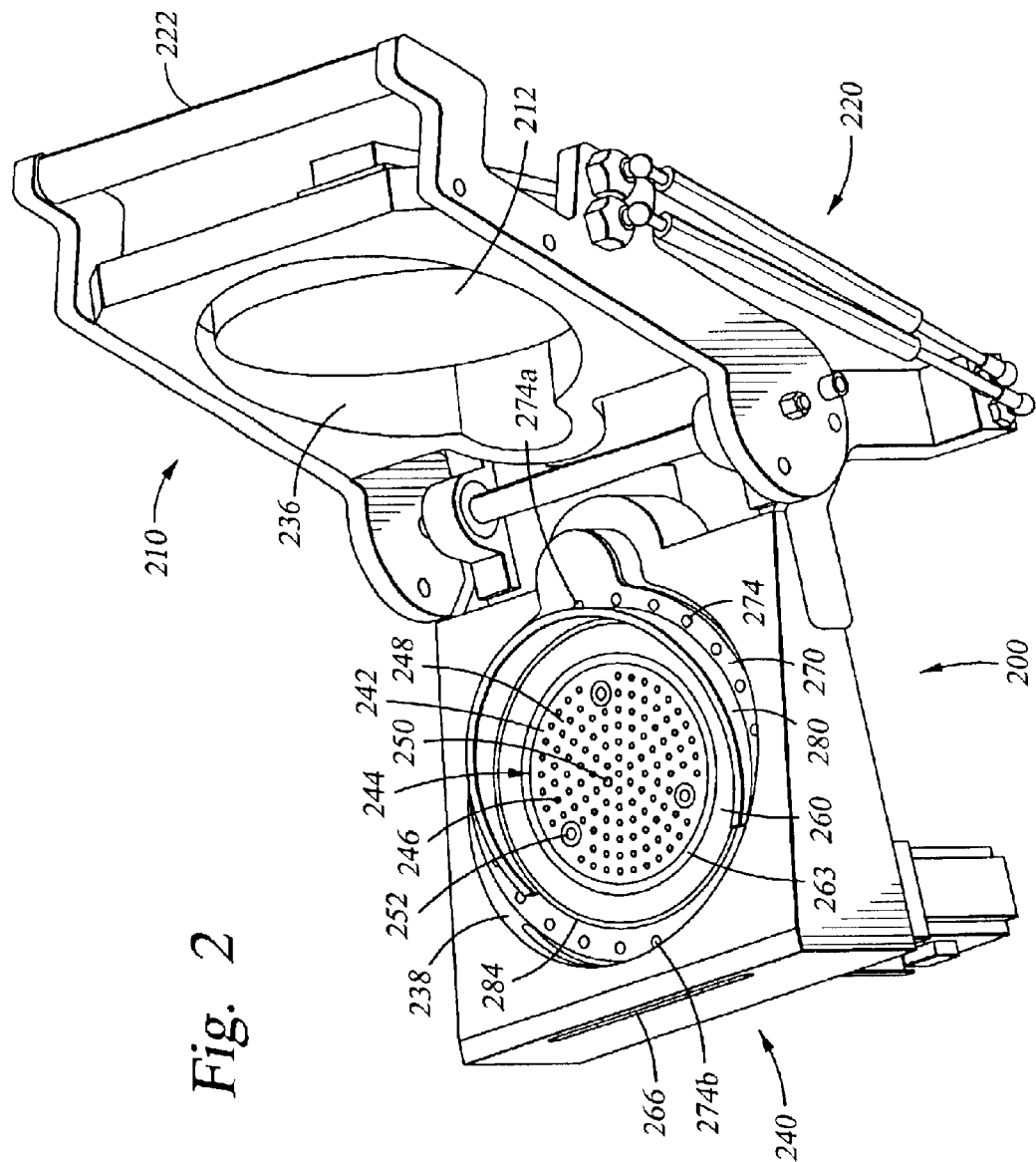
FIG. 2 is a schematic perspective view of one embodiment of a chamber of the invention in an open position.

FIG. 2 is a schematic perspective view of one embodiment of a chamber 200 comprising a top assembly 210 and a bottom assembly 240 in an open position. The bottom assembly 240 includes a fixed substrate support 242 having a substrate receiving surface 244 to support a substrate thereon. The term "fixed substrate support" as used herein is defined to refer to a substrate support which is substantially non-moving vertically (i.e., a fixed elevation) during processing of substrates within the chamber. In some embodiments, the fixed substrate support may rotate and/or may move horizontally during processing of substrates. It is understood that a "fixed substrate support" may be repositioned, removed, or replaced from the chamber when substrate are not being processed within the chamber. The top assembly 210 includes a gas distribution assembly 212 to provide process gases (i.e. reaction gases, purge gases, and/or carrier gases) to the substrate support 242.

The top assembly 210 and the bottom assembly 240 act as a "clamshell pair" which may be selectively moved between an open position and a closed position. An open position provides access for cleaning or replacing of interior components of the chamber 200. In a closed position, the gas distribution assembly 210 is disposed over the substrate receiving surface 244 of the substrate support 242 for processing of substrates through the chamber 200. In a closed position, a processing zone is defined between the substrate support 242 and the gas distribution assembly 212 and between the sidewall of the chamber 200. The top assembly 210 and the bottom assembly 240 are coupled together with a hinge assembly 220. The top assembly 240 includes a handle 222 to assist in moving the chamber 200 between an open position and a closed position.

As shown in this embodiment, the top assembly 210 includes a partial sidewall 236 and the bottom assembly 240 includes a partial sidewall 238. The partial sidewall 236 of the top assembly 210 and the partial sidewall 238 of the bottom assembly 240 together form the sidewall of the chamber 200. In one aspect when the chamber 200 is in an open position, the partial sidewall 238 of the bottom assembly 240 permits access below the substrate support 242 without having to remove the substrate support 242 and, thus, allows for simplified cleaning of areas underneath the substrate support 242.

Figure 3:
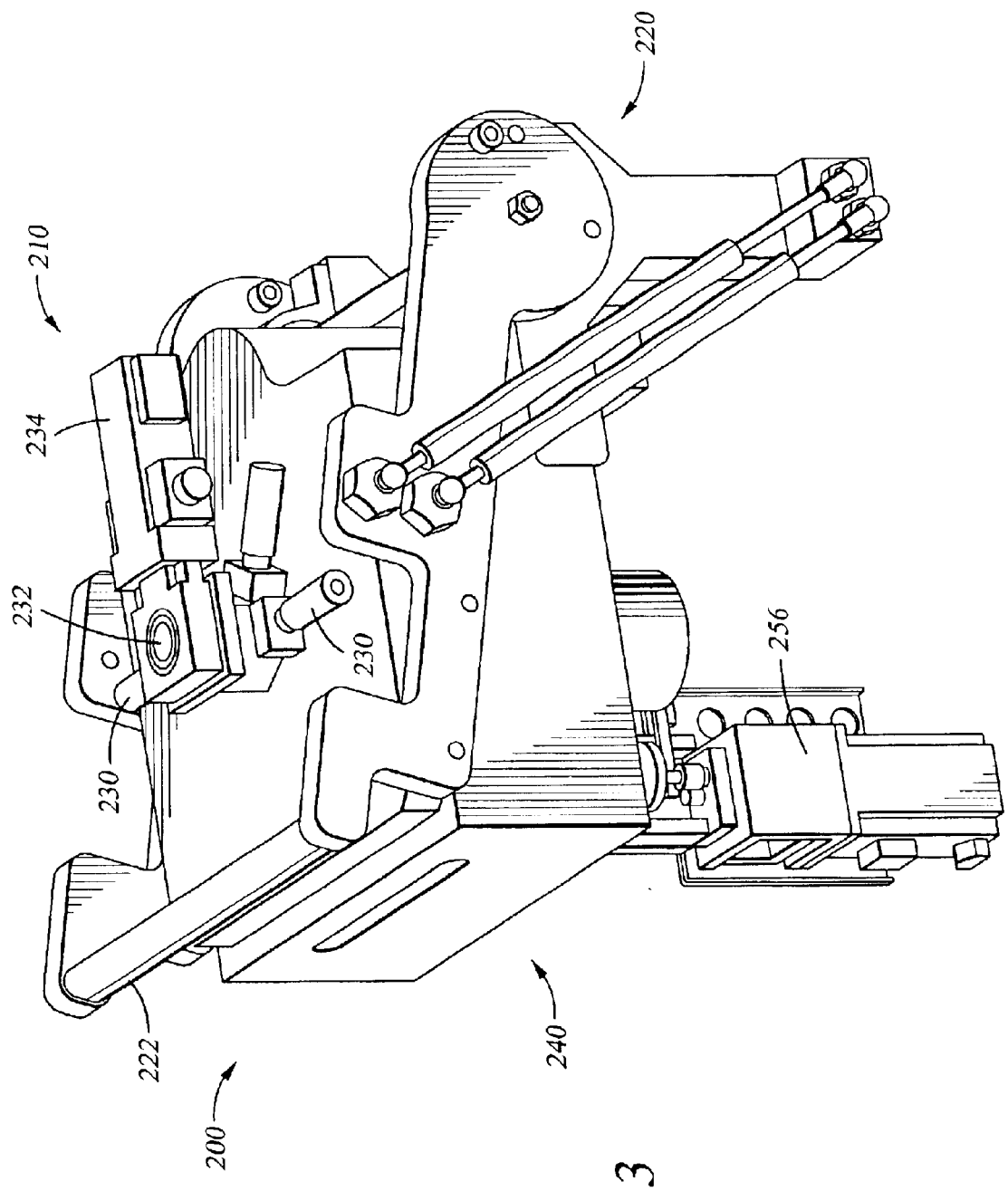
FIG. 3 is a schematic perspective view of the chamber of FIG. 2 in a closed position.

FIG. 3 is a schematic perspective view of the top assembly 210 and the bottom assembly 240 of FIG. 2 in a closed position. The top assembly 210 may include one or more valves 230, such as electronically controlled valves, pneumatically controlled valves, or other suitable valves, to deliver gases to the gas distribution system 212 (as shown in FIG. 2). Preferably, the valves are three-port valves adapted to receive a flow of a reactant gas from a first port, adapted to receive a flow of a purge gas from a second port, and adapted to deliver the purge gas alone and in combination with the reactant gas to a third port. Preferably, the valves 230 are mounted to or in close proximity to a top surface of the top assembly 210 and may be mounted in any position (i.e., vertically, horizontally, or any position in between). The top assembly 210 may further include a gate valve 232 having an inlet adapted to be in fluid communication with a remote plasma source 234. In one embodiment, the remote plasma source 234 is adapted to provide a plasma to the gas distribution assembly 212 (as shown in FIG. 2) to clean chamber components. One example of a remote plasma source is an ASTRON™ remote plasma source available from by ASTeX of Woburn, Mass.

Figure 4:
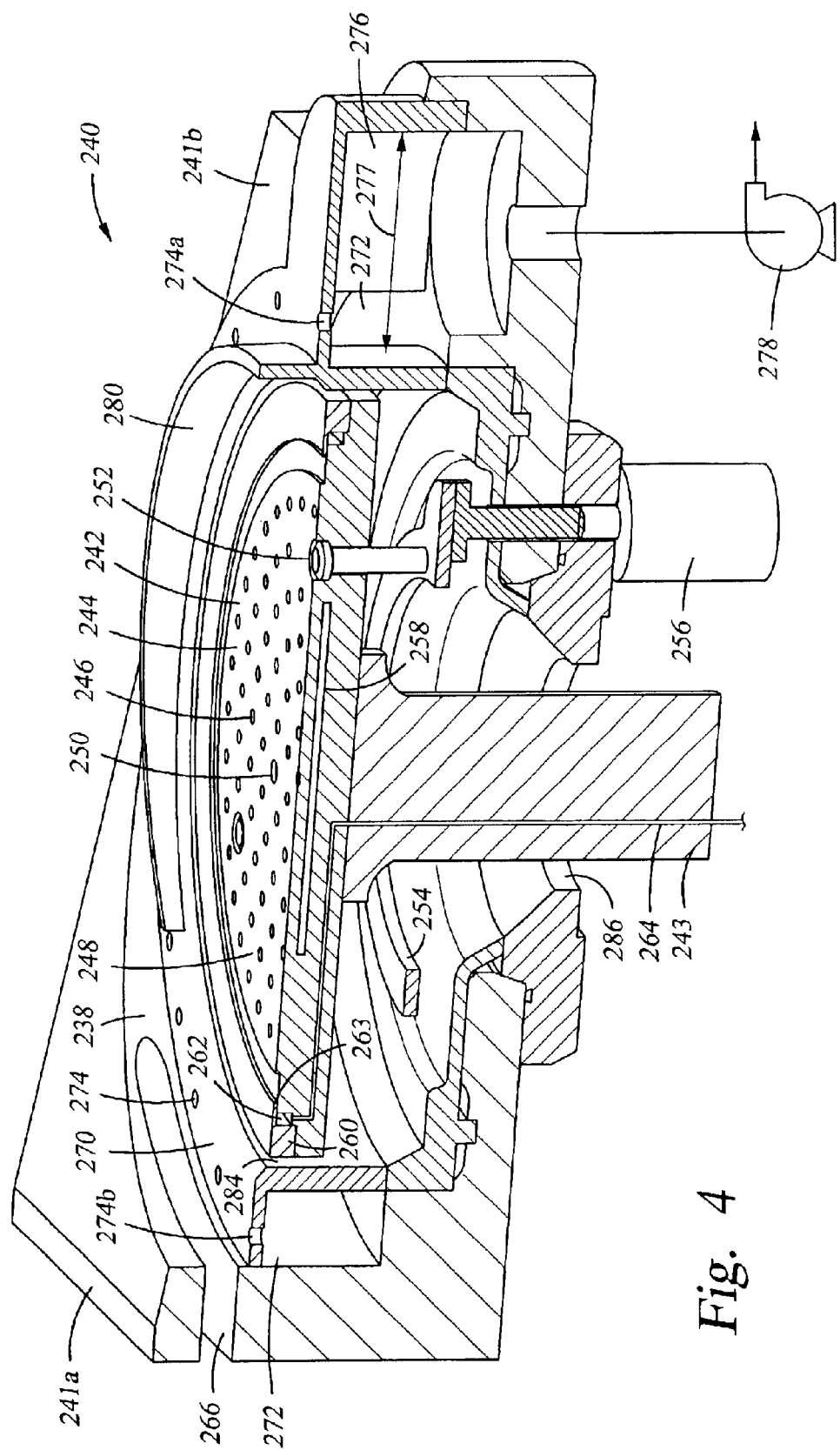
FIG. 4 is a schematic cross-sectional view of the bottom assembly of the chamber of FIG. 2.

FIG. 4 is a schematic cross-sectional view of the bottom assembly 240 of FIG. 2. The upper surface of the body 241 of the bottom assembly 240 is angled so that one portion of the body 241a is above a plane of the substrate receiving surface 244 and one portion of the body 241b is below the plane of the substrate receiving surface 244. The portion of the body 241a above the plane of the substrate receiving surface 244 forms the partial sidewall 238. In one aspect, the portion of the body 241b below the plane of the substrate receiving surface permits access below the substrate support 242 by removing a pumping ring 270, which is discussed in greater detail below. Since the area underneath the substrate support 242 may be accessed without having to remove the substrate support 242, cleaning of this area is simplified.

The bottom assembly 240 may include a slit valve 266 located in the portion of the body 241a above the plane of the substrate receiving surface 244 to provide access for a robot to deliver and retrieve substrates from the chamber. Alternatively, the top assembly 210 may include a slit valve. In either case, the slit valve 266 is preferably adapted to provide access for a thin wrist robot so that the volume of the processing zone defined between the substrate support 242 and the gas distribution assembly 212 may be reduced.

Lift pins 252 are movably disposed through the substrate support 242 to raise and lower a substrate over the substrate receiving surface 244. A lift plate 254 connected to a lift motor 256 may be mounted to the bottom assembly 240 to raise and lower the lift pins 252. The substrate support 242 may be adapted to secure a substrate thereon using a vacuum chuck. For example, the substrate receiving surface 244 may include raised areas 246 (i.e., bumps) adapted to support a substrate thereon and may include recessed areas 248 (i.e., grooves) adapted to support a low pressure region via fluid communication with a vacuum supply from a vacuum introduced through a port 250. Alternatively or in addition, the port 250 may provide a backside gas to enhance thermal conduction between the substrate support 242 and a substrate disposed thereon. The substrate support may also be adapted to hold a substrate thereon, by other techniques. For example, the substrate support may include an electrostatic chuck. The substrate support 242 may be heated using an embedded heated element 258 to heat a substrate disposed thereon. The substrate support may also be heated using other heating sources, such as heating lamps disposed above and/or below the substrate. A purge member 260, such as a purge ring, may be positioned on or adjacent the substrate support 242 to form an annular purge gas channel 262. A purge gas conduit 264 is formed through the substrate support 242 and the stem 243 of the substrate support 242. The purge gas conduit 264 is in fluid communication with a purge gas supply to provide a purge gas to the annular purge gas channel 262. A purge gap 263 between the purge member 260 and the substrate support 242 directs the purge gas to a perimeter portion of the substrate supporting surface 242 to help prevent deposition at the edge and/or backside of the substrate.

The bottom assembly 240 may further include a pumping ring 270 which defines an upper surface of a pumping channel 272. The pumping ring 270 may be an annular member or any other shape depending on the shape of the substrate receiving surface 244. The pumping channel 272 is in fluid communication with a pumping port 276 coupled to a vacuum source 278. In one embodiment, the pumping port 276 is located adjacent one side of the chamber 200. The pumping ring 270 includes a plurality of apertures 274 formed therethrough for the flow of gases from the processing zone to the pumping channel 272 and then, from the pumping channel 272 to the pumping port 276 exiting the chamber 200. Preferably, the upper surface of the pumping channel 272 is disposed below a plane of the substrate receiving surface 244. As shown in this embodiment, the apertures are uniformly sized and uniformly spaced around the pumping ring 270. In other embodiments, the size, the number, and the position of the apertures 274 in the pumping ring 270 may vary depending on the desired flow pattern of gases across the substrate receiving surface 244. For example, the apertures 274 may be adapted to help provide a uniform pressure drop around the perimeter of the substrate receiving surface 244. In one example, the size of the apertures 274a in close proximity to the pumping port 276 may be smaller than the size of the apertures 274b farther from the pumping port 276. In another example, the apertures 274 are uniformly size and are positioned in greater number farther from the pumping port 276.

In one aspect, the diameter of each aperture 274 is preferably greater than the depth of the aperture 274 so that the diameter of each aperture 274 controls restriction of gas flow therethrough rather than the depth of the aperture 274. In another aspect, the total cross-sectional area of the apertures 274 is less than the cross-sectional area 277 of the pumping port 276 so that apertures 274 choke the flow of gas flow therethrough to the pumping port 276. Preferably, the total cross-sectional area of the apertures 274 is between about 1/10 and about 1/3 the cross-sectional area 277 of the pumping port 276. In general, the total cross-sectional area of the apertures 274 for a chamber operated at a low pressure is greater than the total cross-sectional area of apertures 274 for a chamber operated at a high pressure.

A gas-flow diffuser 280 may be disposed on the pumping ring 270 radially inward of the apertures 274 to change the flow path of gases to the apertures 274. As shown in FIG. 2 and FIG. 4, the gas-flow diffuser 280 extends partially around the substrate receiving surface 244 and is tapered from its highest height proximate apertures 274a adjacent the pumping port 276. In one aspect, the gas-flow diffuser 280 extends partially around the substrate receiving surface 244 to allow for transport of a substrate between the slit valve 266 and the lift pins 252. In other embodiments, the gas-flow diffuser 280 may extend entirely around the substrate receiving surface 244. In addition, the height of the gas-flow diffuser 280 may vary along its length in steps and/or in tapered segments. Alternatively, the gas-flow diffuser may have a uniform height. At least a portion of the gas-flow diffuser 280 extends above a plane defined by the substrate receiving surface 244. Not wishing to be bound by theory, it is believed that the gas-flow diffuser 280 helps provide a uniform pressure drop around the substrate receiving surface 244.

In one embodiment, the substrate support 242 is sized and shaped to provide a gap 284 between the substrate support 242 and the pumping ring 270. The width of the gap 284 may be selected to control heat transfer between the substrate support 242 and the pumping ring 270, to control the flow of purge gas between the substrate support 242 and pumping ring 270, and/or to allow for thermal expansion of the substrate support 242. In one embodiment, the width of the gap 284 is between about 0.03 inches and about 0.12 inches. A purge gas port 286 may be disposed below the substrate support 242 to provide a bottom purge gas which flows through the gap 284 to the apertures 274 to prevent the flow of process gases below the substrate support 242 and prevent gases from entering and depositing in the area below the substrate support 242. In one embodiment, the purge gas port 286 is adapted to provide a bottom purge gas to a higher pressure than the pressure in the processing zone defined between the substrate support 242 and the gas distribution assembly 212.

Figure 5:
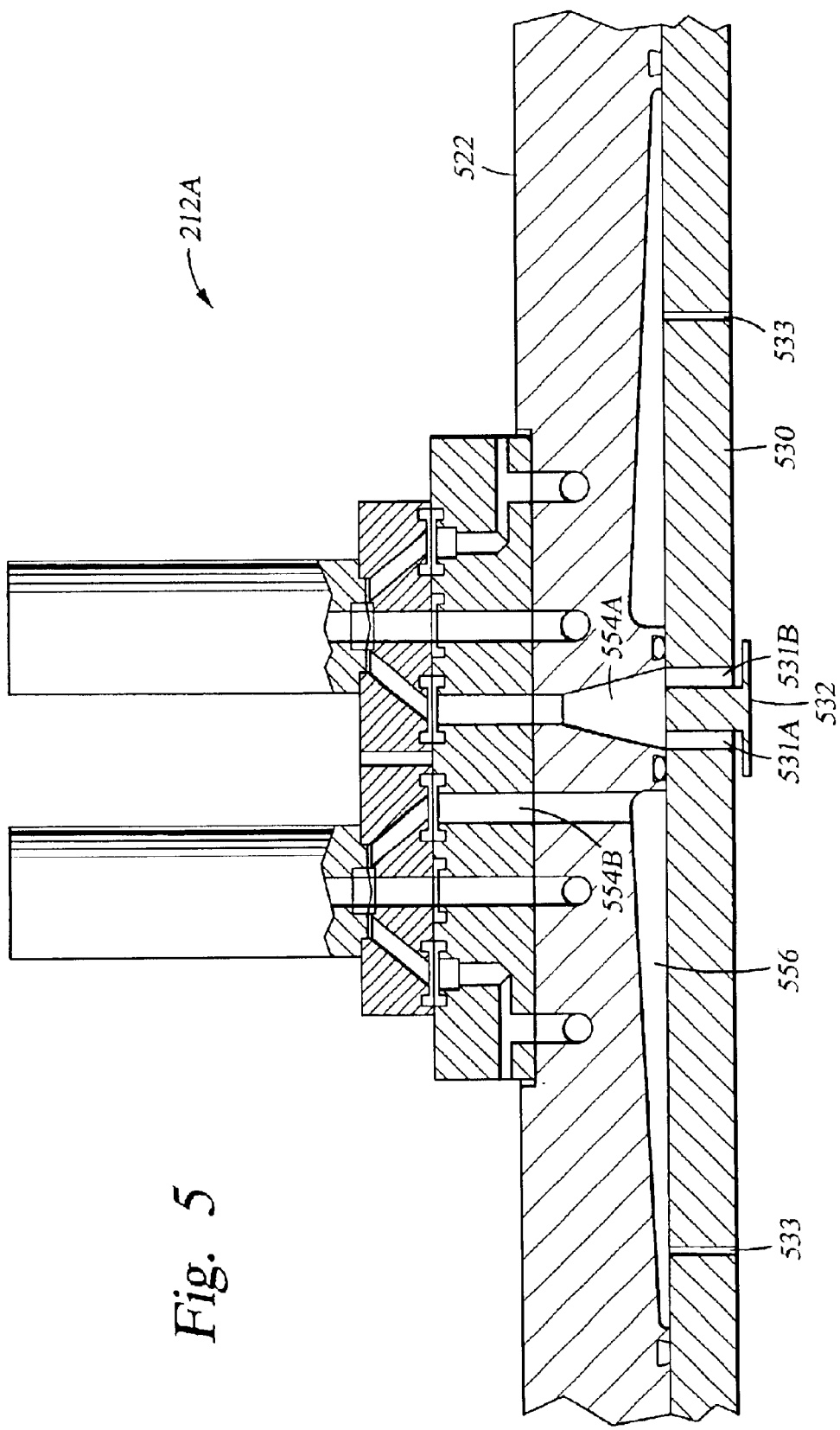
FIG. 5 is a schematic cross-sectional view of one embodiment of a gas distribution assembly.

In reference to FIG. 2, the bottom surface of the body 211 of the top assembly 210 is angled to match the angled upper surface of the body 241 of the bottom assembly 240. The gas distribution assembly 212 may be any suitable gas distribution apparatus or showerhead. FIG. 5 is a schematic cross-sectional view of one embodiment of gas distribution assembly 212A. The gas distribution system illustrated in FIG. 5 is more fully described in U.S. patent application Ser. No. 10/032,293 entitled "Chamber Hardware Design For Titanium Nitride Atomic Layer Deposition" to Nguyen et al. filed on Dec. 21, 2001, which is incorporated by reference in its entirety to the extent not inconsistent with the present disclosure.

Gas distribution assembly 212A comprises a lid plate 522 and a distribution plate 530 disposed below the lid plate 522 which provide one or more isolated zones/flow paths therethrough. As shown in FIG. 5, a first flow path is provided through an outlet gas channel 554A formed through the lid plate 554 and through centrally located openings 531A and 531B formed through the distribution plate 530 to the processing zone. An inner diameter of the gas channel 554A gradually increases within the lid plate 522 to decrease the velocity of the flow of gas therethrough. A dispersion plate 532 is also disposed adjacent the openings 531A, 531B to prevent the flow of gas therethrough from impinging directly on the substrate surface by slowing and re-directing the velocity profile of the flowing gases. Without this re-direction, the force asserted on the substrate by the flow of gas through the first flow path may prevent deposition because the kinetic energy of the impinging gas may sweep away reactive molecules already disposed on the substrate surface. A second flow path is provided through an outlet gas channel 554B formed through the lid plate 554, through a cavity 556 formed between the lid plate 554 and distribution plate 530, and through apertures 533 formed in the distribution plate 530. The position of the apertures 533 may vary along the cavity 556. Different valves are coupled to the outlet gas channel 554A and the outlet gas channel 554B to provide a first gas through the first flow path and to provide a second gas through the second flow path. In other embodiments, the lid plate 522 and the distribution plate 530 may be adapted to provide one flow path or more than two flow paths.

Figure 6:
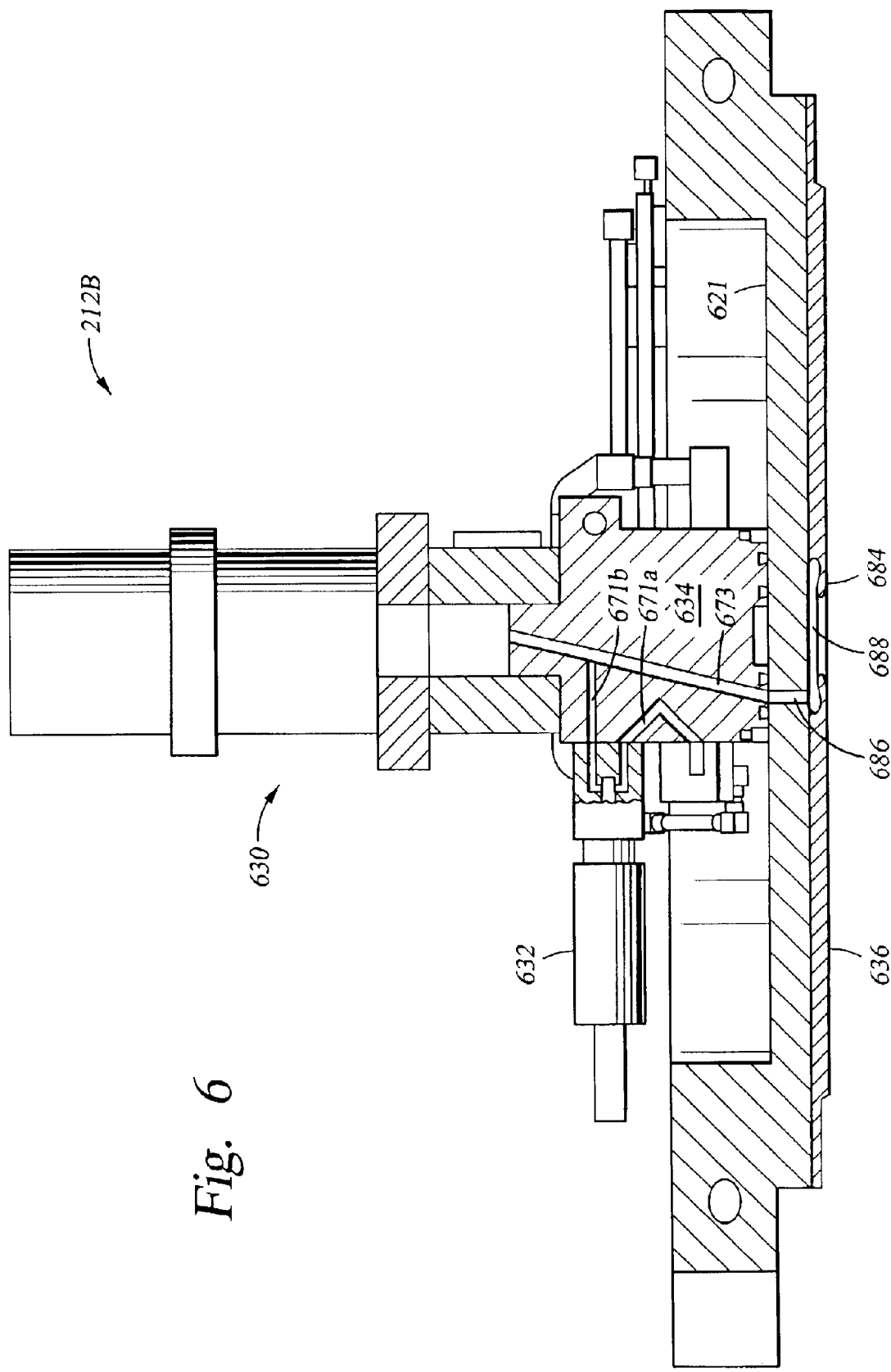
FIG. 6 is a schematic cross-sectional view of another embodiment of a gas distribution assembly.

FIG. 6 is a schematic cross-sectional view of another embodiment of a gas distribution system 212B. The gas distribution system 212B is shown and described in U.S. patent application Ser. No. 10/016,300 entitled "Lid Assembly For A Processing System To Facilitate Sequential Deposition Techniques," filed on Dec. 12, 2001, which claims priority to U.S. Provisional Application Ser. No. 60/305,970 filed on Jul. 16, 2001, which are both incorporated by reference in their entirety to the extent not inconsistent with the present disclosure.

The gas distribution system 212B includes a lid 621 and a process fluid injection assembly 630 to deliver reactive gases (i.e. precursor, reductant, oxidant), carrier gases, purge gases, cleaning gases and/or other fluids into the processing chamber. The fluid injection assembly 630 includes a gas manifold 634 mounting a plurality of control valves 632 (one is shown in FIG. 6), and a baffle plate 636. Each valve 632 is fluidly coupled to a separate trio of gas channels 671a, 671b, 673 (one trio is shown in FIG. 6) of the gas manifold 634. Gas channel 671a provides passage of gases through the gas manifold 634 to the valve 632. Gas channel 671b delivers gases from the valve 632 through the gas manifold 634 and into a gas channel 673. Channel 673 is fluidly coupled to a respective inlet passage 686 disposed through the lid 621. Gases flowing through the inlet passages 686 flow into a plenum or region 688 defined between the lid 621 and the baffle plate 636 before entering the processing zone. The baffle plate 636 is utilized to prevent gases injected into the processing zone from blowing off gases adsorbed onto the surface of the substrate. The baffle plate 636 may include a mixing lip 684 to redirect gases toward the center of the plenum 688 and into the process chamber.

Figure 7:
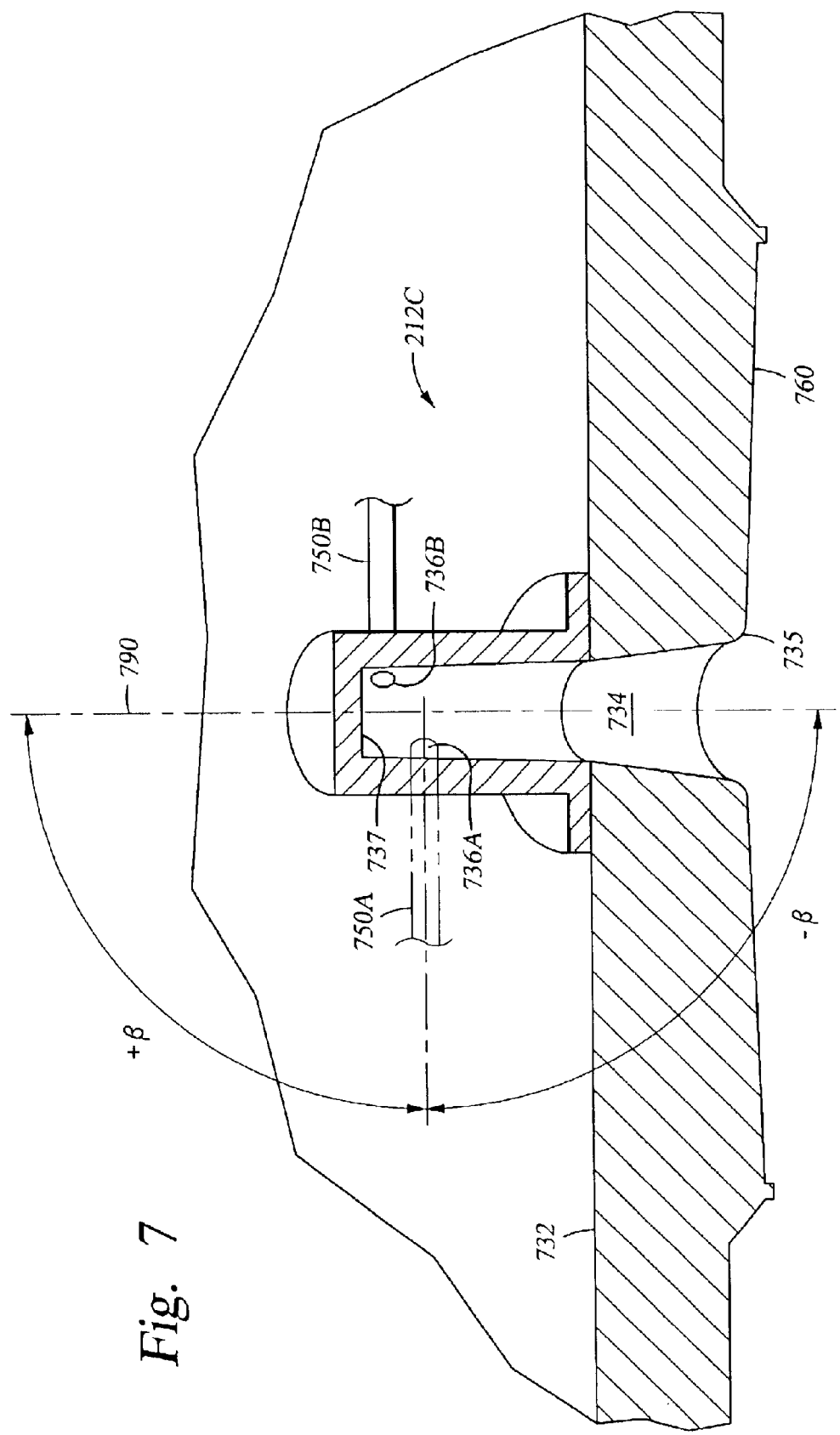
FIG. 7 is a schematic cross-sectional view of another embodiment of a gas distribution assembly.

FIG. 7 is a schematic cross-sectional view of another embodiment of a gas distribution system 212C. The gas distribution system 212C is shown and described in U.S. patent application Ser. No. 10/032,284 entitled "Gas Delivery Apparatus and Method for Atomic Layer Deposition," filed on Dec. 21, 2001, which claims benefit of U.S. provisional Patent Application Ser. No. 60/346,086, entitled "Method and Apparatus for ALD Deposition," filed Oct. 26, 2001, which are both incorporated by reference in their entirety to the extent not inconsistent with the present disclosure.

The gas distribution system 212C comprises a chamber lid 732. The chamber lid 732 includes an expanding channel 734 extending from a central portion of the chamber lid 732 and a bottom surface 760 extending from the expanding channel 734 to a peripheral portion of the chamber lid 732. The bottom surface 760 is sized and shaped to substantially cover a substrate disposed on the substrate support. The expanding channel 734 has gas inlets 736A, 736B to provide gas flows from two similar valves. The gas inlets 736A, 736B are located adjacent the upper portion 737 of the expanding channel 734. In other embodiments, one or more gas inlets may be located along the length of the expanding channel 734 between the upper portion 737 and a lower portion 735. Each gas conduit 750A, 750B and gas inlet 736A, 736B may be positioned horizontally normal to the longitudinal axis 790 or may be angled downwardly at an angle +β or may be angled upwardly at an angle −β to the longitudinal axis 790.

The expanding channel 734 comprises a channel which has an inner diameter which increases from an upper portion 737 to the lower portion 735 of the expanding channel 734 adjacent the bottom surface 760 of the chamber lid 732. Whether a gas is provided toward the walls of the expanding channel 734 or directly downward towards the substrate, the velocity of the gas flow decreases as the gas flow travels through the expanding channel 734 due to the expansion of the gas. The reduction of the velocity of the gas flow helps reduce the likelihood the gas flow will blow off reactants adsorbed on the surface of the substrate.

Figure 7A:
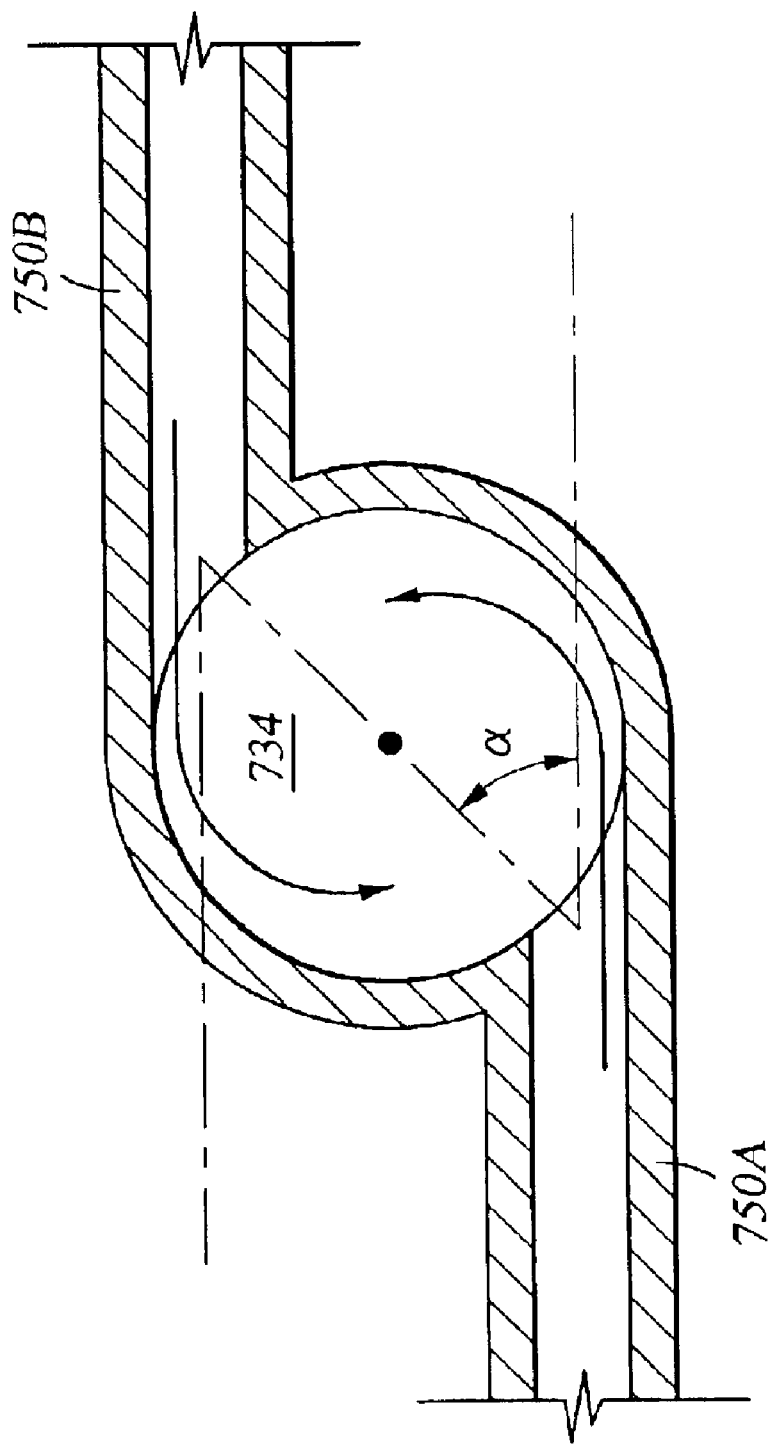
FIG. 7A is a top cross-sectional view of the gas distribution assembly of FIG. 7.

FIG. 7A is a top cross-sectional view of one embodiment of the expanding channel of the chamber lid of FIG. 7. Each gas conduit 750A, 750B may be positioned at an angle a from a center line of the gas conduit 750A, 750B and from a radius line from the center of the expanding channel 734. Entry of a gas through the gas conduit 750A, 750B preferably positioned at an angle α (i.e., when α>0°) causes the gas to flow in a circular direction as shown by arrows. Providing gas at an angle α as opposed to directly straight-on to the walls of the expanding channel (i.e. when α=0°) helps to provide a more laminar flow through the expanding channel 734 rather than a turbulent flow.

At least a portion of the bottom surface 760 of the chamber lid 732 may be tapered from the expanding channel 734 to a peripheral portion of the chamber lid 732 to help provide an improved velocity profile of a gas flow from the expanding channel 734 across the surface of the substrate (i.e., from the center of the substrate to the edge of the substrate). In one embodiment, the bottom surface 760 is tapered in the shape of a funnel. Not wishing to be bound by theory, in one aspect, the bottom surface 760 is downwardly sloping to help reduce the variation in the velocity of the gases as it travels between the bottom surface 760 of the chamber lid 732 and the substrate to help provide uniform exposure of the surface of the substrate to a reactant gas.

Figure 8:
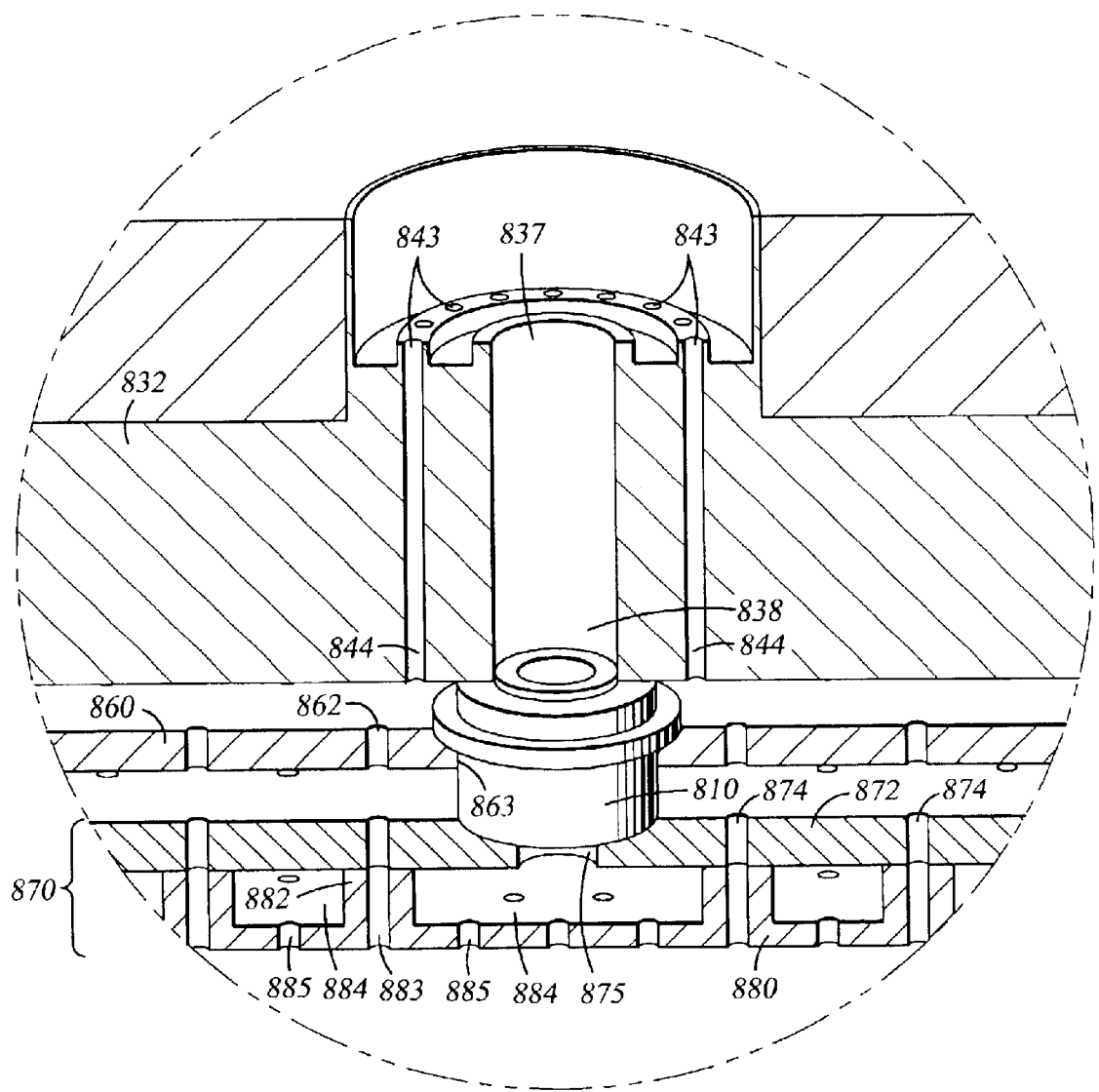
FIG. 8 is a schematic cross-sectional view of another embodiment of a gas distribution assembly.

FIG. 8 is a schematic cross-section view of another embodiment of a gas distribution system 212D. The gas distribution system 212D is shown and described in U.S. patent application Ser. No. 10/118,664 (APPM/6422), which is incorporated by reference in its entirety to the extent not inconsistent with the present disclosure.

Gas distribution system 212 comprises a gas box 832, a top shower plate 860 positioned below the gas box 832, and a bottom shower plate 870 positioned below the top shower plate 860. The gas distribution system 830 is adapted to provide gas flows to the substrate. The gas box 832 comprises a central gas channel 837 and a plurality of outer gas channels 843. The central gas channel 837 provides one discrete path for the flow of one or more gases through the gas box 832 while the outer channels 843 provides another discrete path for the flow of one or more gases through the gas box 832. The central gas channel 837 is coupled to a first gas source through a first valve. The central gas channel 837 has a first gas outlet 838 and is adapted to deliver a first gas from the first gas source 835 to a gas conduit 810. The term "gas" as used herein is intended to mean a single gas or a gas mixture. The outer gas channels 843 are coupled to a second gas source through a second valve 842. The outer gas channels 843 have second gas outlets 844 and are adapted to deliver a second gas from the second gas source 841 to the top shower plate 860. Preferably, the second gas outlets 844 of the outer gas channels 843 are adapted to deliver the second gas proximate a central portion of the top shower plate.

The top shower plate 860 has a plurality of holes 862 to accommodate a gas flow therethrough from the outer gas channels 843 of the gas box 832 to the bottom shower plate 870. The gas conduit 810 is disposed through an aperture 863 in the top shower plate 860 and is disposed on the bottom shower plate 870.

The bottom shower plate 870 comprises a first piece 872 connected to a second piece 880. The first piece 872 has a plurality of holes 874 to provide a flow of a gas therethrough. The second piece 880 comprises a plurality of columns 882 having column holes 883 formed therethrough and a plurality of grooves 884 having groove holes 885 formed therethrough. The top surface of the columns 882 are connected to the bottom surface of the first piece 872 so that the column holes 883 align with the holes 874 of the first piece 872. Therefore, one discrete passageway is provided through the holes of the first piece 872 and through the column holes 883 of the columns 882 to deliver a gas flow from the top shower plate 860 to the substrate. An aperture 875 is formed through the first piece 872 and aligns with the grooves on the second piece 880. Therefore, another discrete passageway is provided through the aperture 875 of the first piece 872 and through the grooves 884 and groove holes 885 of the second piece 880 to deliver a gas flow from the gas conduit 810.

Figure 9:
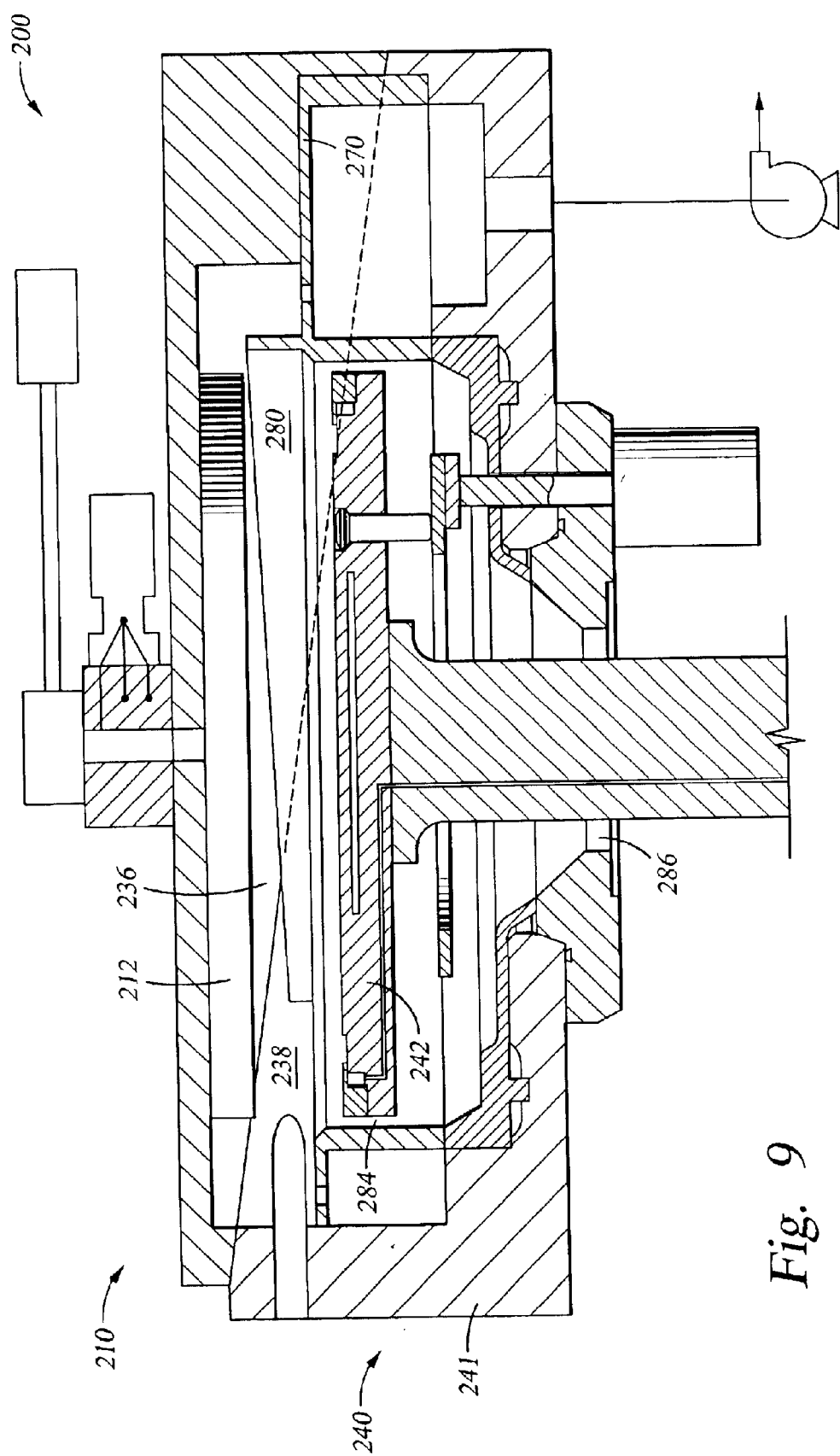
FIG. 9 is a schematic cross-sectional view of the top assembly and the bottom assembly in a closed position.

FIG. 9 is a schematic cross-sectional view of the top assembly 210 and the bottom assembly 240 of chamber 200 in a closed position. The top assembly 210 includes a gas distribution system 212, such as the gas distribution systems described in reference to FIGS. 5–8 or any other suitable gas distribution system. In one aspect, since the substrate support 242 is fixed, there is a smaller volume below the substrate support 242 since the volume does not have to take into account vertical movement of the substrate support 242. In another aspect, the chamber provides easy access underneath the substrate support 242. Therefore, the chamber may be cleaned without removing and realigning the substrate support 242.

In one aspect, reactant gases flow from the gas distribution system 212 to a processing zone defined between the substrate support 242 of the bottom assembly 240 and the gas distribution assembly 212 of the top assembly 210. In one embodiment, the spacing between the gas distribution assembly 212 and the substrate support 242 is about 0.75 inches or less to minimize the volume of the processing zone. The bottom purge gas flowing through the gap 284 between the substrate support 242 and the pumping ring 270 prevents the flow of process gases below the substrate support 242. A smaller amount of reactant gases and/or purge gases are required to be provided to the chamber 200 through the gas distribution assembly 212 since reactant gases/purge gases from the gas distribution assembly 212 do not fill the volume below the substrate support 242. For example, a smaller amount of reactant gases are required for a certain exposure of the substrate to the reactant gases. In addition, a smaller amount of purge gas is required to be provided through the gas distribution assembly 212 to remove the reactant gases from the chamber 200 since the purge gas does not need to remove reactant gases from the volume below the substrate support 242. Therefore, the throughput of the chamber 200 is greater and waste may be minimized due to the smaller amount of gases used. For example, the time duration of pulses of a compound may be reduced. In addition, the time duration required to purge the chamber of a compound may be reduced.

The chamber 200 as shown and described in reference to FIGS. 2–9 may be used to form any suitable material, such as aluminum oxide, other metal oxides, tantalum nitride, tantalum, tantalum silicon nitride, copper, copper aluminum, titanium nitride, titanium, titanium silicon nitride, tungsten nitride, tungsten, tungsten silicon nitride, organosilanes or organosiloxanes, other refractory metals, other refractory metal nitrides, other refractory metal compounds, other metals, other metal alloys, other high dielectric constant materials, other low dielectric constant materials, and other materials. The chamber 200 may be used to perform any suitable deposition technique, such as chemical vapor deposition, atomic layer deposition, cyclical layer deposition, and other suitable deposition techniques. Preferably, the chamber 200 is particularly advantageous in performing cyclical layer deposition. The term "cyclical layer deposition" as used herein refers to the sequential introduction of pulses of one or more compounds to deposit a thin layer of material on a substrate. Compounds can be reactants, reductants, precursors, catalysts, and mixtures thereof. Sequentially providing pulses of compounds may result in the formation of thin layers of material over a substrate structure. Each thin layer of material may be less than a monolayer, a monolayer, or more than a monolayer of material. The sequential introduction of pulses of compounds may be repeated to deposit a plurality of thin layers forming a conformal layer to a desired thickness. For simplicity and ease of description, however, a process for depositing an aluminum oxide film using chamber 200 is described in more detail below. In one embodiment, a method of depositing an aluminum oxide layer in chamber 200 over a substrate includes introducing an aluminum-containing compound, such as trimethyl aluminum, and an oxidizing compound through the gas distribution system 212. The aluminum containing compound and the oxidizing compound may be introduced as a cycle of pulses through the gas distribution system 212. A purge gas may be used to at least partially separate pulses of the aluminum containing compound and the oxidizing compound. In one embodiment, the pulses of the aluminum containing compound and the oxidizing compound are dosed into a continuous flow of a purge gas. In another embodiment, pulses of a purge gas are introduced through the gas distribution system 212. The process may further include one or more annealing sequences and/or oxidizing sequences performed at various times during the aluminum oxide deposition cycle. For example, an annealing step may be performed after every deposition cycle or after any number of cycles are performed. As an example, an annealing step may be performed every third cycle, every four cycle, etc. or at a midpoint during the deposition process. Other deposition processes of aluminum oxide are also possible.

EXAMPLES

The following examples will now reveal additional details and features concerning embodiments of the processing chamber. The following examples should not be construed to limit the scope of the invention unless expressly set forth in the claims.

Simulations were conducted of the flow of gases in regards to chambers, such as a chamber described in reference to FIG. 2 and FIG. 4, having gas-flow diffusers of different heights. An uniform top flow of gases was provided to the substrate. Each chamber included a pumping ring having 24 apertures and a gas-flow diffuser extending between about 60% and about 70% around the perimeter of the substrate receiving surface 244. In Example 1, the gas-flow diffuser had a tapered height with a maximum height of about 0.8 inches. In Example 2, the gas-flow diffuser had a tapered height with a maximum height of about 0.7 inches. The simulations estimated the velocity of gases 0.1 inch above a substrate positioned on a substrate support of the chambers. The simulations of Example 1 and Example 2 showed that the flow of gases were substantially uniform across the surface of the substrate.

While the foregoing is directed to embodiments of the present invention, other and further embodiments of the invention may be devised without departing from the basic scope thereof, and the scope thereof is determined by the claims that follow. For example, many dimensions depend on the quantity of gas flow through the chamber.

What is claimed is:

1. A processing chamber, comprising:
   a first assembly comprising a first assembly body having an upper surface and a fixed substrate support having a substrate receiving surface, wherein the upper surface of the first assembly body is shaped and sized so that at least a portion thereof is below the substrate receiving surface of the substrate support;
   a second assembly comprising a gas distribution assembly; and
   a hinge assembly coupling the first assembly and the second assembly, wherein the first assembly and the second assembly can be selectively positioned between an open position and a closed position.

2. The processing chamber of claim 1, wherein the upper surface of the first assembly body is angled.

3. The processing chamber of claim 1, wherein the portion of the first assembly body below the substrate receiving surface provides access below the substrate support.

4. The processing chamber of claim 1, wherein a portion of the first assembly body is above the substrate receiving surface.

5. The processing chamber of claim 1, wherein a portion of the first assembly body is above the substrate receiving surface and forms a first partial sidewall.

6. The processing chamber of claim 5, wherein the second assembly comprises a second assembly body, a portion of the second assembly body forming a second partial sidewall.

7. The processing chamber of claim 6, wherein a processing zone is defined between the fixed substrate support, the gas distribution assembly, the first partial sidewall, and the second partial sidewall.

8. The processing chamber of claim 5, further comprising a slit valve formed in the first partial sidewall of the first assembly body.

9. The processing chamber of claim 1, further comprising a resistive heating element disposed in the substrate support.

10. A processing chamber, comprising:
- a first assembly comprising a first assembly body having an upper surface and a fixed substrate support having a substrate receiving surface, wherein the upper surface of the first assembly body is shaped and sized so that at least a portion thereof is below the substrate receiving surface of the substrate support;
- a pumping ring disposed around a perimeter of the substrate receiving surface, the pumping ring forming at least a portion of a pumping channel and having one or more apertures formed therethrough;
- a second assembly comprising a gas distribution assembly; and
- a hinge assembly coupling the first assembly and the second assembly, wherein the first assembly and the second assembly can be selectively positioned between an open position and a closed position.

11. The processing chamber of claim 10, wherein the one or more apertures provide fluid communication between the pumping channel and a processing zone between the fixed substrate support and the gas distribution assembly.

12. The processing chamber of claim 10, wherein the pumping ring is shaped and sized so that the one or more apertures are positioned below a plane defined by the substrate receiving surface.

13. The processing chamber of claim 10, wherein the apertures are distributed evenly around the pumping ring.

14. The processing chamber of claim 10, wherein the position of the apertures varies around the pumping ring.

15. The processing chamber of claim 10, wherein the apertures have uniform size.

16. The processing chamber of claim 10, wherein the apertures having varying size.

17. The processing chamber of claim 10, further comprising a gas-flow diffuser disposed between the apertures of the pumping ring and the substrate receiving surface.

18. The processing chamber of claim 17, wherein the gas-flow diffuser is disposed on the pumping ring.

19. The processing chamber of claim 17, wherein the gas-flow diffuser extends partially around the perimeter of the substrate receiving surface.

20. The processing chamber of claim 17, wherein the gas-flow diffuser extends entirely around the perimeter of the substrate receiving surface.

21. The processing chamber of claim 17, wherein the gas-flow diffuser has different heights.

22. The processing chamber of claim 17, wherein the gas-flow diffuser is tapered.

23. The processing chamber of claim 17, wherein the gas-flow diffuser has a uniform height.

24. The processing chamber of claim 10, further comprising a gap between the substrate support and the pumping channel.

25. The processing chamber of claim 24, further comprising a gas port below the substrate support, the gas port adapted to provided a bottom purge gas through the gap between the substrate support and the pumping channel.

26. The processing chamber of claim 10, wherein the spacing between the substrate support and the gas distribution assembly is about 0.75 inches or less.

27. The processing chamber of claim 10, further comprising a resistive heating element disposed in the substrate support.

* * * * *

UNITED STATES PATENT AND TRADEMARK OFFICE
CERTIFICATE OF CORRECTION

PATENT NO. : 6,866,746 B2 Page 1 of 1
APPLICATION NO. : 10/302774
DATED : March 15, 2005
INVENTOR(S) : Lawrence C. Lei et al.

It is certified that error appears in the above-identified patent and that said Letters Patent is hereby corrected as shown below:

Column 7, Line 50: After "angle", change "a" to --α--

Signed and Sealed this

Eighth Day of August, 2006

JON W. DUDAS
*Director of the United States Patent and Trademark Office*